(12) United States Patent
Koizumi et al.

(10) Patent No.: US 6,252,351 B1
(45) Date of Patent: Jun. 26, 2001

(54) LIGHT EMITTING DIODE ARRAY

(75) Inventors: Genta Koizumi; Katsuhiko Sakai; Hiroshi Mabuchi, all of Ibaraki; Mitsuru Yamazaki, Kanagawa; Seiichi Kurihara, Kanagawa; Yuji Abe, Kanagawa, all of (JP)

(73) Assignees: Hitachi Cable Ltd, Tokyo; Fujitsu Limited, Kanagawa-ken, both of (JP)

( * ) Notice: Subject to any disclaimer, the term of this patent is extended or adjusted under 35 U.S.C. 154(b) by 0 days.

(21) Appl. No.: 09/219,303

(22) Filed: Dec. 23, 1998

(30) Foreign Application Priority Data

Dec. 25, 1997 (JP) .................................................... 9-357959

(51) Int. Cl.⁷ ...................................................... H01J 1/62
(52) U.S. Cl. ............................................................. 313/498
(58) Field of Search ............................ 313/498; 257/350, 257/81, 84, 98, 91, 99, 88

(56) References Cited

U.S. PATENT DOCUMENTS 5,067,809 * 11/1991 Tsubota ................................... 357/17
5,821,567 * 10/1998 Ogihara et al. ......................... 257/88
5,977,565 * 11/1999 Ishikawa et al. ........................ 257/81
5,994,739 * 11/1999 Nakagawa et al. .................... 257/350

* cited by examiner

Primary Examiner—Ashok Patel
Assistant Examiner—Matthew J. Gerike
(74) Attorney, Agent, or Firm—Carter, Ledyard & Milburn

(57) ABSTRACT

A contact layer having a low resistance in an LED is extended from an inside edge of a light take-out region in a light emitting dot to a central position thereof, whereby an input current in the light take-out region expands, while an electrode is extended from an inside edge of the light take-out region to the center of the light take-out region so as to shape like substantially a letter T with a length which is not over the center, whereby increase in an electrode covering ratio in the light take-out region can be suppressed. As a result, a uniform light output in the light take-out region can be attained, so that a light output can be remarkably improved. When electrodes in the light take-out regions in adjacent light emitting dots are staggered relative to the direction perpendicular to an aligned direction of the light take-out region (a reference straight line), the light take-out regions are arranged horizontally in substantially a straight line, so that a light emitting pattern in the aligned direction of the light take-out regions are not so staggered. Thus, an LED array having a high output and a uniform distribution of light intensity is provided.

8 Claims, 3 Drawing Sheets

LIGHT EMITTING DIODE ARRAY

FIELD OF THE INVENTION

The present invention relates to a light emitting diode (hereinafter referred to simply as "LED") array, and more particularly to an LED array providing a high light output and a uniform distribution of light intensity.

BACKGROUND OF THE INVENTION

There is a GaAlAs LED as one of the LEDs, and since such LED exhibits high intensity, they are arrayed to provide an LED array which has been utilized as a light source for LED printer.

FIG. 1 is a plan view showing an example of conventional LEEDs, and FIG. 2 is a plan view showing another example of conventional LEDs.

LED array has a fine structure, and it is classified into two types. One of them is peripheral electrode type LED array (FIG. 1) wherein an electrode (peripheral electrode) 30 is disposed on a side (peripheral part) of a light take-out region 20 in a light emitting dot 10, and the other type is a central electrode type LED array (FIG. 2) wherein an electrode (central electrode) 31 is disposed at an central portion of a light take-out region 21 in a light emitting dot 11. In either of the LEDs, the electrode 30 or 31 is disposed through a contact layer 40 or 41 for electrode, and the electrode 30 or 31 is connected to a metal interconnection 50 or 51.

In the peripheral electrode type LED shown in FIG. 1, since the peripheral electrode 30 is disposed on a peripheral portion of the light take-out region 20, it is very difficult to uniformly expand an input current over the whole area of the light take-out region 20. As a result, the light which can be taken out from the light take-out region 20 decreases with increase in a distance from the peripheral electrode 30, because the light output decreases, resulting in unevenness of light output in the light take-out region 20, besides, high light output cannot be obtained in this case. Furthermore, there is a possibility of variations in a mode of expanding an input current depending upon a slight difference in crystallizability of each LED, so that variations of each LED in an LED array become also remarkable.

Moreover, since distribution of light intensity is biased toward the peripheral electrode 30, there has been such a problem that a light emitting region effective for printing of an LED printer is not arranged horizontally in a straight line, but staggered, even in the light take-out regions 20 of adjacent LEDs are arranged horizontally in a straight line.

On the other hand, in the central electrode type LED shown in FIG. 2, since the central electrode 31 is positioned in a central portion of the light take-out region 21, this type of LEDs can overcome the above-mentioned disadvantage involved in peripheral electrode type LEDs. In other words, the input current can be extended over the whole area of the light take-out region 21 in the central electrode type LEDs.

However, in the case where a finer structure of LED is required as, for example, in a high density LED array of 600 DPI or more, when a central electrode type structure is used, a size of the central electrode cannot be reduced further because of assuring reliability. For this reason, a ratio of LED covered by electrode (hereinafter referred to as "electrode covering ratio") increases, so that it becomes difficult to obtain an LED of high output. In addition, as a result of providing the remarkably narrow light take-out region 21, a problem arises also in a shape of light emitting spot.

SUMMARY OF THE INVENTION

Accordingly, an object of the present invention is to provide an LED array affording a high light output and a uniform distribution of light intensity.

According to the invention, an LED array, comprises: a light take-out region provided on a pn junction structured by a cladding layer of a first conductivity type and an active layer of a second conductivity type, the light take-out region having a predetermined area; a contact layer provided on the cladding layer, the contact layer being extended from an inside edge of the light take-out region beyond a central position of the light take-out region; and an electrode provided on the contact layer, the electrode being extended from an inside edge of the light take-out region not to reach the central position thereof.

This invention is concerned with an LED array containing an electrode disposed on a part of each of a plurality of light emitting dots, and an interconnection drawn out alternatively with respect to the direction perpendicular to the aligned direction of the light emitting dots (referred also as "reference straight line"), wherein the electrodes in adjacent light take-out regions are staggered relative to the reference straight line.

In addition to the above described constitution, a light emitting pattern formed by light take-out regions may be arranged in a straight line in the present invention.

According the present invention, a contact layer having a low resistance and made of GaAs or a GaAlAs layer having a low Al mixed crystal ratio is extended from an inside edge of a light take-out region in a light emitting dot to a central position thereof, whereby an input current in the light take-out region expands, and on the other hand, an electrode is extended from an inside edge of a light take-out region to the center of the light take-out region so as to shape like substantially a letter T with a length which is not over the center, whereby increase in an electrode covering ratio in the light take-out region can be suppressed. In other words, the electrode and the contact layer contribute significantly for expanding an input current in the light take-out region. Thus, a uniform light output in the light take-out region can be attained, and the light output can be remarkably improved.

Furthermore, when electrodes in the light take-out regions in adjacent light emitting dots are staggered relative to the direction perpendicular to an aligned direction of the light take-out regions (reference straight line), the light take-out regions are arranged horizontally in substantially a straight line, so that a light emitting pattern in the aligned direction of the light take-out regions are not so staggered, even if light emitting regions effective for printing of an LED printer deviate to a peripheral electrode side.

BRIEF DESCRIPTION OF THE DRAWINGS

The present invention will be explained in more detail in conjunction with appended drawings, wherein.

DESCRIPTION OF THE PREFERRED EMBODIMENTS

Figure 3:
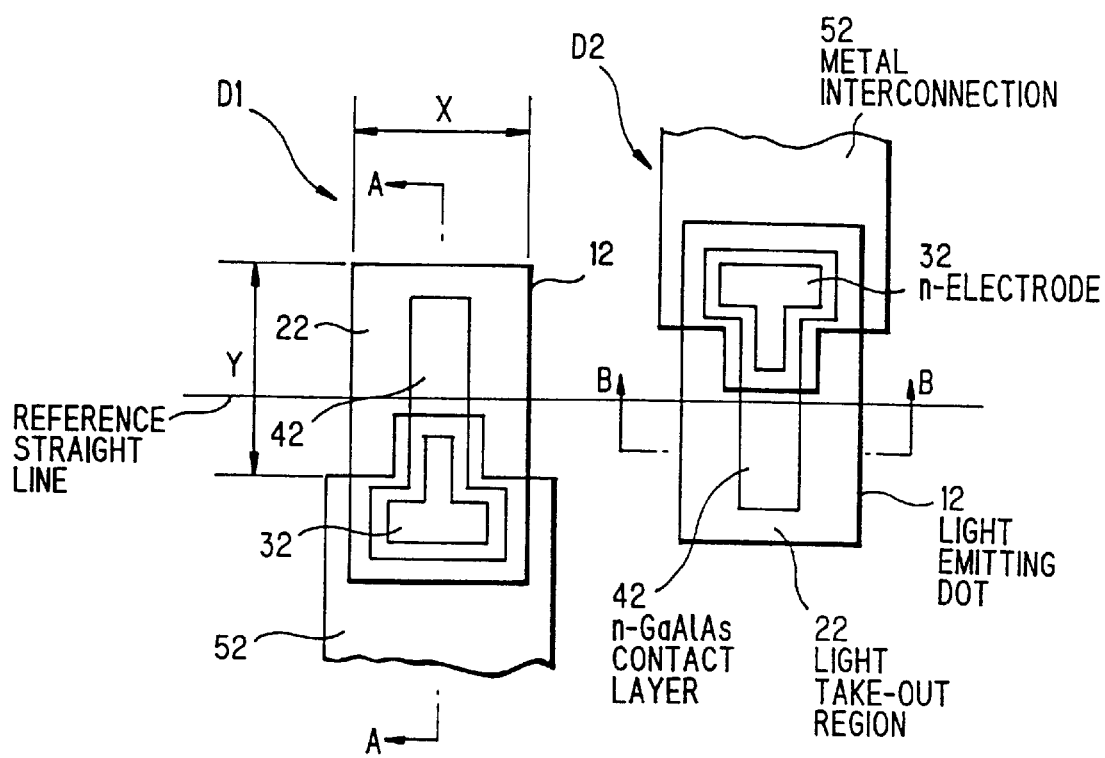
FIG. 3 is a plan view showing LED array according to an embodiment of the present invention.

An embodiment of the present invention will be described hereinafter in conjunction with the accompanying drawings wherein FIG. 3 is a plan view showing an LED array according to the embodiment of the invention. In FIG. 3, two adjacent LEDs in a peripheral electrode type GaAlAs LED array are shown. This LED is a GaAlAs LED having a mesa isolated type single hetero structure.

In an LED D1 shown on the left side of FIG. 3, a contact layer 42 is disposed on one side (the lower side in the figure) of a light take-out region 22 in a light emitting dot 12, and a peripheral electrode 32 is formed on the contact layer 42. The contact layer 42 is extended from an inside edge of the light take-out region 22 to a central position thereof, while the peripheral electrode 32 is extended from an inside edge of the light take-out region 22 to the center of the light take-out region 22 so as to shape like substantially a letter T with a length which is not over the center.

In an LED D2 shown on the right side of FIG. 3, a contact layer 42 is disposed on one side (the upper side in the figure) of a light take-out region 22, and a peripheral electrode 32 is formed on the contact layer 42. The contact layer 42 is extended from an inside edge of the light take-out region 22 to a central position thereof, while the peripheral electrode 32 is extended from an inside edge of the light take-out region 22 to the center of the light take-out region 22 so as to shape like substantially a letter T with a length which is not over the center. Namely, the LED D2 is an inverted state with respect to the LED D1.

A horizontal length X and a vertical length Y of the light take-out region 22 of the LED D1 are 25 $\mu$m and 30 $\mu$m, respectively, so that the LED D1 has been very finely designed. The peripheral electrode (n-electrode) 32 is disposed on a side of the light take-out region 22, and connected to a metal interconnection 52 made of Au or the like.

The contact layer 42 is formed under the n-electrode 32 in order to take good ohmic junction between the n-electrode 32 and the light take-out region 22. This contact layer 42 is made from n-type GaAs having a low resistance or a GaAlAs layer having a very small mixed crystal ratio, and it is extended further from a contact portion with the n-electrode 32 along a central portion of the light take-out region 22 with a width of 9 $\mu$m. Further, the n-electrode 32 is extended from a peripheral portion of the light emitting dot 12 to a central portion of the light take-out region 22 in a shape like substantially letter T with a length of about 10 $\mu$m. Moreover, the light take-out region 22 of the light emitting diode D1 and the light take-out region 22 of the light emitting diode D2 adjacent to each other are staggered in such that the respective n-electrodes 32, 32 approach in the Y-direction with each 5 $\mu$m displacement in up and down directions.

Figure 4:
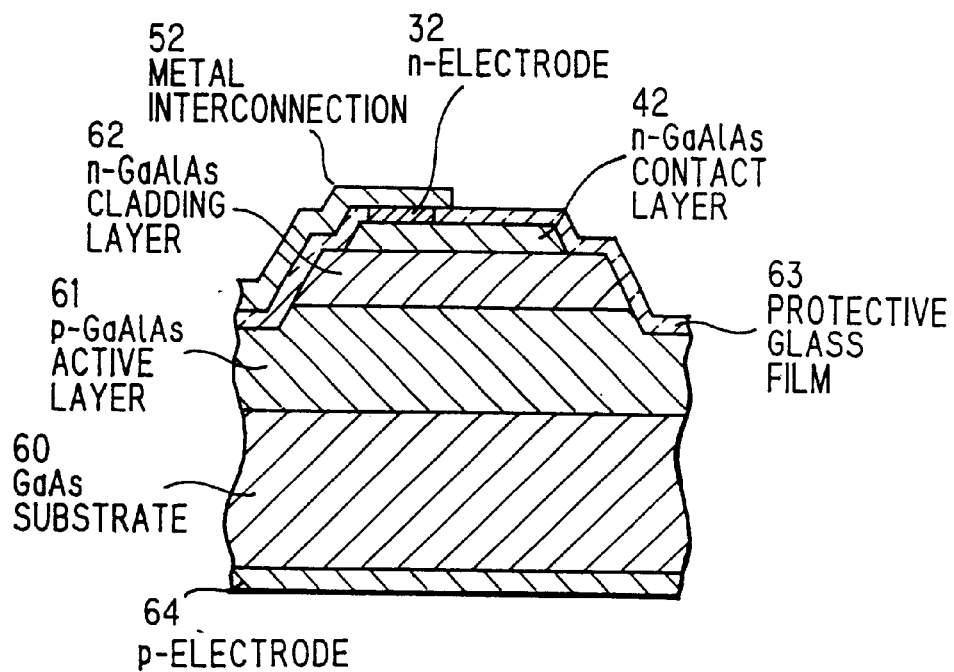
FIG. 4 is a sectional view of the led array taken along the line A-A of FIG. 3.
Figure 5:
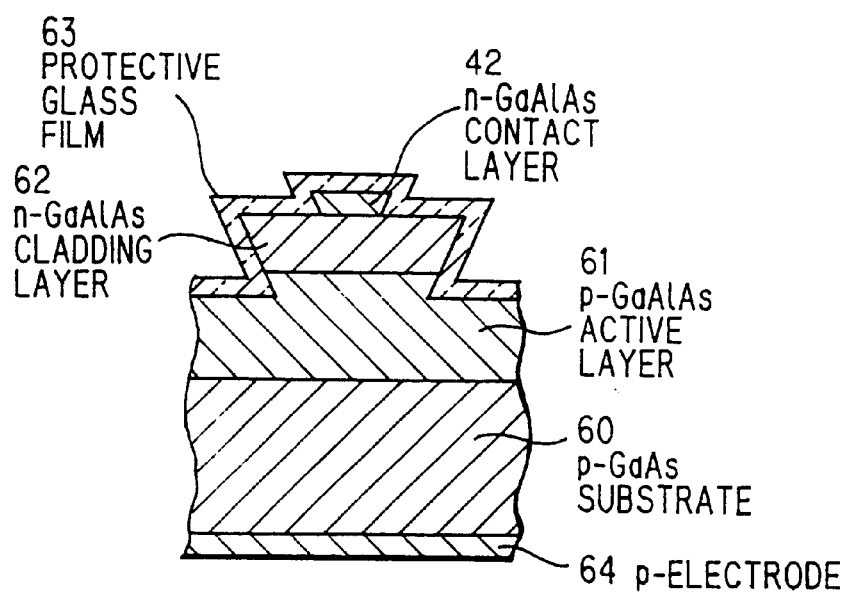
FIG. 5 is a sectional view of the LED array taken along the line B-B of FIG. 3.

FIG. 4 is a sectional view of an LED array taken along the line A-A of FIG. 3, and FIG. 5 is a sectional view of the LED array taken along the line B-B of FIG. 3.

An active layer (p-GaAlAs layer) 61 and a cladding layer (n-GaAlAs layer having a high Al mixed crystal ratio) 62 are formed on a p-GaAs substrate 60. A pn layer composed of the active layer 61 and the cladding layer 62 has a single hetero structure, and is a mesa separate type as mentioned above. An n-contact layer (which exhibits a low resistance as a result of being doped at a high concentration, and is a GaAlAs layer having a very low Al mixed crystal ratio) is formed on the n-GaAlAs layer 62. A protective glass film 63 and the n-electrode 32 are formed on the surfaces of the n-GaAlAs layer 62 and the GaAlAs layer 42, and a metal interconnection 52 is formed on the n-electrode 32. A p-electrode 64 is attached to the underside of the LED D1.

When the LED array as described above is energized, a current input from the n-electrode 32 expands into the whole area of the light take-out region 22 formed in the vicinity of the pn interface through the contact layer 42 in spite of having a peripheral electrode structure. This is because there is an n-type GaAlAs layer as the contact layer 42 which has been extended alone a central portion of the light take-out region 22, and the n-electrode 32 as a peripheral electrode has been extended from an inside edge of the light emitting dot 12 toward the central direction by 10 $\mu$m.

Accordingly, uniform light output can be realized in the light take-out region 22, and in addition, high light output can be attained. An amount of the n-electrode 32 to be extended depends upon a longitudinal length of the light take-out region 22. In the present embodiment, since a longitudinal length of the light take-out region is 30 $\mu$m, an amount to be extended is set at 10 $\mu$m.

On one hand, the adjacent light take-out regions 22, 22 are staggered with a distance of each about 5 $\mu$m in such that the respective n-electrodes 32, 32 approach in the Y-direction. This is because close areas of n-electrodes 32 wherein light intensity becomes the most intensive in the light take-out region 22 are allowed to be close to each other in the Y-direction, whereby there is an effect of preventing from appearance of a staggered distribution of a light emitting pattern of the light take-out region 22 effective for printing operation by an LED printer.

Figure 1:
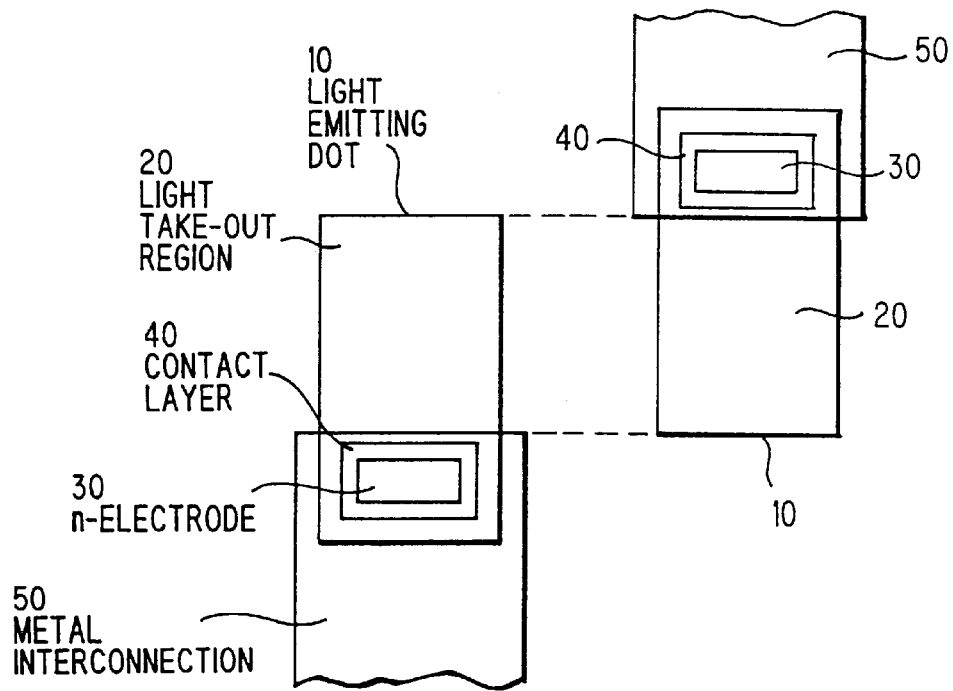
FIG. 1 is a plan view showing a conventional LED array.
Figure 2:
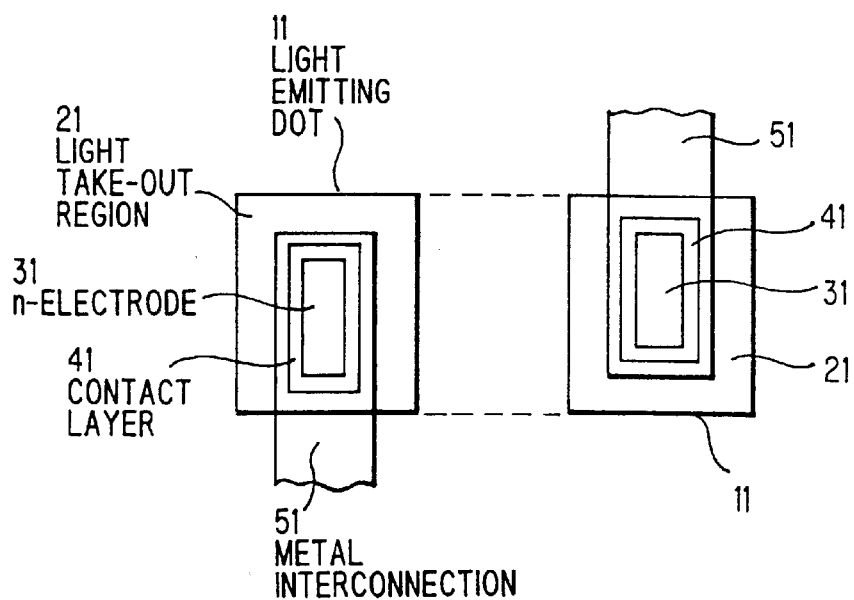
FIG. 2 is a plan view showing another conventional LED array.

Samples of the conventional LED array shown in FIG. 2 and that of the present invention shown in FIG. 3 are prepared with light take-out regions each having the same size, and both the light outputs obtained therefrom are compared. As a result, about 1.4 times higher light output can be obtained in the LED array shown in FIG. 3 as compared with that in the LED array shown in FIG. 2. Furthermore, variations in light output of each LED contained in a LED array have been heretofore_16%, while they become an average_8% in the LED shown in FIG. 3 so that they can be remarkably improved. Likewise, about 10% higher light output than that of the LED array shown in FIG. 2 was obtained in the LED array shown in FIG. 3.

As described above, when the peripheral electrode is somewhat extended from a vicinity of the light take-out region toward a central position of the light take-out region, and the contact layer having a low resistance in the peripheral electrode is extended along the direction toward a central position of the light take-out region in the present embodiment, the same current distribution effect as that of a central electrode type LED can be obtained in a peripheral electrode type LED, besides increase in electrode covering ratio in light take-out region which is a disadvantage involved in a central electrode type LED array can be avoided. As a consequence, it becomes possible to manufacture a high light output and high density LED array. Furthermore, since adjacent light take-out regions are staggered in such that their electrodes approach to each other in the Y-direction, such a disadvantage that a light emitting pattern of a light emitting region effective for printing of an LED printer becomes staggered in a conventional peripheral electrode type LED array can be solved.

In brief, the following excellent advantages can be achieved in accordance with the present invention.

(1) An LED array having a high light output and a uniform distribution of light intensity can be provided by such an arrangement that a contact layer is extended from an inside edge of a light take-out region to a central position thereof, while a peripheral electrode is extended from an inside edge of the light take-out region to the center of the light take-out region so as to shape like substantially a letter T with a length which is not over the center.

(2) An LED array having a high light output and a uniform distribution of light intensity can be provided by such an arrangement that electrodes in adjacent light take-out regions are staggered so as to approach to each other with respect to the direction perpendicular to an aligned direction of the light take-out regions (reference straight line).

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A plurality of LEDs arranged in array; each of said plurality of LEDs, comprising:
    a light take-out region provided on a pn junction structured by a cladding layer of a first conductivity type and an active layer of a second conductivity type, said light take-out region having a predetermined area;
    a contact layer provided on said cladding layer, said contact layer being extended from an inside edge of said light take-out region beyond a central position of said light take-out region; and
    an electrode provided on said contact layer, said electrode being extended from an inside edge of said light take-out region not to reach said central position thereof.

2. The LED array as defined in claim 1, wherein:

said light take-out region is positioned on a reference straight line defined by connecting predetermined positions of said light take-out region of said each of said plurality of LEDs.

3. The LED array as defined in claim 2, wherein:

said light take-out region is shaped to be rectangular.

4. The LED array as defined in claim 3, wherein:

said light take-out region is positioned to be staggered relative to said reference straight line.

5. The LED array as defined in claim 4, wherein:

said contact layer is positioned to be staggered in said light take-out region relative to said reference straight line.

6. The LED array as defined in claim 4, wherein:

said electrode is positioned to be staggered on said contact layer in said light take-out region relative to said reference straight line.

7. The LED array as defined in claim 5, wherein:

said contact layer is shaped to be T-letter.

8. The LED array as defined in claim 6, wherein:

said electrode is shaped to be T-letter.

* * * * *